(12) United States Patent
Li

(10) Patent No.: US 7,580,269 B2
(45) Date of Patent: Aug. 25, 2009

(54) APPARATUS FOR SUPPLYING POWER TO A SEMICONDUCTOR DEVICE USING A CAPACITOR DC SHUNT

(75) Inventor: Yuan-Liang Li, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 28 days.

(21) Appl. No.: 11/943,468

(22) Filed: Nov. 20, 2007

(65) Prior Publication Data

US 2008/0079136 A1 Apr. 3, 2008

Related U.S. Application Data

(62) Division of application No. 10/334,807, filed on Dec. 31, 2002, now Pat. No. 7,317,622.

(51) Int. Cl.
H05K 7/02 (2006.01)
H05K 7/06 (2006.01)
H05K 7/08 (2006.01)
H05K 7/10 (2006.01)

(52) U.S. Cl. ............... 361/782; 361/765; 361/785; 361/306.3

(58) Field of Classification Search ......... 361/763–765, 361/782–785
See application file for complete search history.

(56) References Cited

U.S. PATENT DOCUMENTS 5,929,646 A * 7/1999 Patel et al. ............. 324/754

| | | | |
|---|---|---|---|
| 6,346,743 B1 | 2/2002 | Figueroa et al. | |
| 6,446,317 B1 | 9/2002 | Figueroa et al. | |
| 6,461,493 B1 | 10/2002 | Farooq et al. | |
| 6,461,895 B1 | 10/2002 | Liang et al. | |
| 6,624,444 B1 * | 9/2003 | Li | 257/59 |
| 6,907,658 B2 * | 6/2005 | Li | 29/832 |

\* cited by examiner

*Primary Examiner*—Tuan T Dinh
(74) *Attorney, Agent, or Firm*—Mager Johnson & McCollom, P.C.

(57) ABSTRACT

A power shunt for use within a semiconductor device of a type having a motherboard and an integrated circuit package electrically coupled to the motherboard and of a type having a spaced portion located between the motherboard and the package. The power shunt comprises a capacitor within the spaced portion between the motherboard and the package of the semiconductor device. The capacitor includes a conductive layer of a first type, a conductive layer of a second type, and a dielectric layer that electrically isolates the first type conductive layer from the second type conductive layer, wherein said first type conductive layer and second type conductive layer form a conductive bridge between the motherboard and the package. The arrangement of the capacitor fulfills the dual function of providing decoupling capacitance with the capability of supplying an additional path of current between the motherboard and package to the die load.

7 Claims, 6 Drawing Sheets

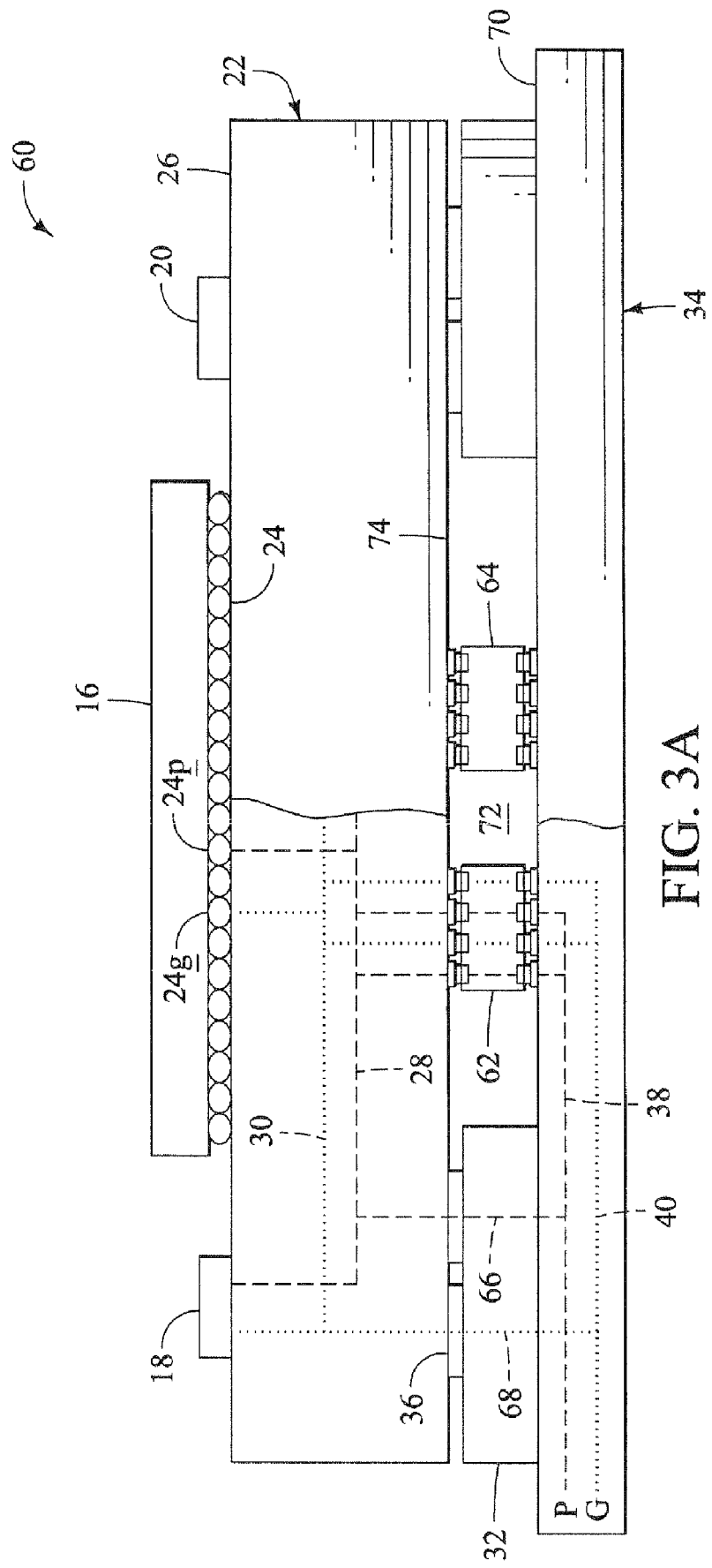

APPARATUS FOR SUPPLYING POWER TO A SEMICONDUCTOR DEVICE USING A CAPACITOR DC SHUNT

CROSS REFERENCE TO RELATED APPLICATIONS

This application is a divisional of U.S. patent application Ser. No. 10/334,807, filed on Dec. 31, 2002, now pending, the disclosure of which is herein incorporated by reference.

BACKGROUND OF THE INVENTION

This invention relates generally to power delivery systems for microelectronic circuits, and more particularly to methods and apparatuses for supplying power to such devices through a capacitor DC shunt.

As the frequencies of microprocessors increase, the currents supplied through sockets required to power these devices increases proportionally. One method used to manufacture devices operating at increased frequencies is to reduce the size of the device using improved lithographic techniques. Accordingly, while the magnitude of the current increases, the amount of area used to carry the current through the socket is decreased. High currents through sockets require low resistances in order to have small power dissipation. This relationship is described by the equation: $P=I^2R$ (Power=Current squared times the Resistance). Larger power dissipations in the socket result in higher temperatures in the socket, and higher temperatures are known to cause problems with the operational reliability of the microprocessor. Judging by current trends in microprocessor design, the anticipated maximum current required to power designs in the near future will exceed socket limitations by 20%~30%.

One method for increasing currents through sockets to supply the high currents to higher power CPU's is currently solved by increasing the number of pins. Increasing the number of power supply pins lowers the total resistance and results in a lower power dissipation. This is costly not only in terms of actual dollar cost for the extra pins, but also for the chip real estate needed for the extra pins. In addition, if the number of pins added for power dissipation does not provide a much lower resistance than the resistance of the pins in the core region, the effectiveness of the additional pins may not sufficiently reduce the current flowing through one region of the package. In other words, additional pins must provide an effective DC shunt.

Accordingly, the need remains for an alternate method for supplying current to microprocessors of ever-decreasing dimensions.

BRIEF DESCRIPTION OF THE DRAWINGS

FIG. 3A is a side elevation with partial cross-section of an integrated circuit device constructed according to the present invention.

DETAILED DESCRIPTION

Figure 1:
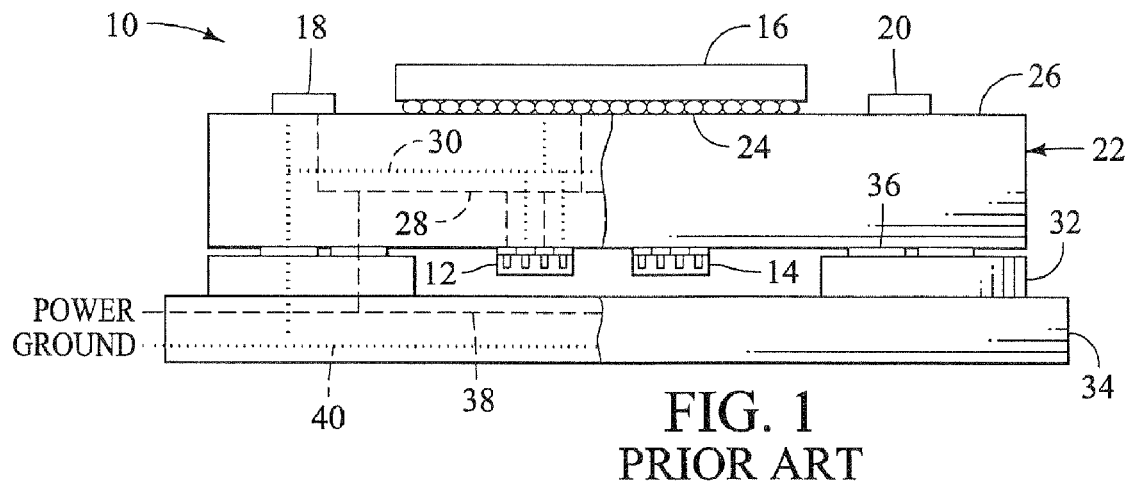
FIG. 1 is a side elevation with partial cross-section of an integrated circuit device including standard land-side decoupling capacitor arranged according to the prior art.

FIG. 1 illustrates an integrated circuit device 10 that includes a set of land-side decoupling capacitors 12, 14 in accordance with the prior art. Starting from the top of FIG. 1, an integrated circuit 16 and one or more discrete capacitors 18, 20 are housed by IC package 22. Integrated circuit 16 contains one or more circuits that are electrically connected to IC package 22. In one embodiment of the prior art, integrated circuit 16 is a microprocessor, although integrated circuit 16 could be other types of devices in other embodiments. In the example shown, integrated circuit 16 is a "flip chip" type of integrated circuit, meaning that the input/output and power/ground terminations on the chip can occur at any point on its surface. After the chip or die 16 has been readied for attachment to IC package 22, it is flipped over and attached, via solder bumps or balls 24 to matching pads (not shown) on the top surface 26 of IC package 22. Alternatively, integrated circuit 16 could be a surface mount chip, where input/output and power/ground terminations are connected to IC package 22 using bond wires to pads on the top surface 26 of the IC package 22.

Integrated circuit 16 contains one or more circuits that are electrically connected to IC package, as via ball connectors 24. While some of the ball connectors 24 couple to input/output circuits for transferring digital information between the die 16 and the remainder of the integrated circuit device 10, others are used to provide connectors to power 28 (denoted in dashed line) and ground 30 (denoted in dotted line) conductors within the package 22. One or more of the IC circuits act as a die load, which may require capacitance, noise suppression, and/or power dampening. Some of this capacitance is provided, in the prior art, by the discrete capacitors 18, 20 spaced about the integrated circuit die 16 and electrically coupled to the power 28 and ground 30 conductors within the package.

As circuit 10 frequencies delve into the gigahertz (GHz) region, with their associated high frequency transients, noise in the DC power and ground lines increasingly becomes a problem. This noise can arise due to inductive and capacitive parasitics, for example, as is well known. To reduce such noise, capacitors known as decoupling capacitors 12, 14 are often used to provide a stable signal or stable supply of power to the circuitry.

Capacitors are further utilized to dampen power overshoot when an electronic device, such as a microprocessor, is powered up, and to dampen power droop when the electronic device begins using power. For example, a microprocessor that begins performing a calculation may rapidly need more current than can be supplied by the on-chip capacitance. In order to provide such capacitance and to dampen the power droop associated with the increased load, off-chip capacitance should be available to respond to the current need within a sufficient amount of time. If insufficient current is available to the processor, or if the response time of the capacitance is too slow, the die voltage may collapse.

Decoupling capacitors 12, 14 and capacitors 18, 20 for dampening power overshoot or droop are generally placed as close to the load as practical to increase the capacitors' effectiveness. Often, these capacitors are surface mounted to the electronic device or the package substrate on which the device is mounted. At increasingly reduced device sizes and packing densities, however, available real estate for surface-mounted capacitors becomes a limiting factor. In the case of the microprocessor apparatus shown in FIG. 1, the package 22 includes decoupling capacitors 12, 14 affixed to the underside (or "land-side") of the package 22 directly underneath the microprocessor die 16. The close proximity of these off-chip sources of capacitance means that each source has a relatively low inductance path to the die 16.

IC package 22 is coupled to a socket 32 on a PC board 34. In the example shown, IC package 22 includes pins (not shown) that mate with pads 36 and complementary pin holes in socket 32. Alternately, IC package 22 could be electrically and physically connected to PC board 34 using solder connections, such as ball grid array connections, for example.

PC board 34 could be, for example, a motherboard for a computer system. As such, it acts as a vehicle to supply power, ground, and other types of signals to integrated circuit 16. These power, ground, and other signals are supplied through traces 38, 40 on PC board 34, socket 32, pins, and traces 28, 30 on IC package 22. The IC device 10 described above in conjunction with various embodiments could be connected to a PC board forming part of a general-purpose computer system.

Figure 2A:
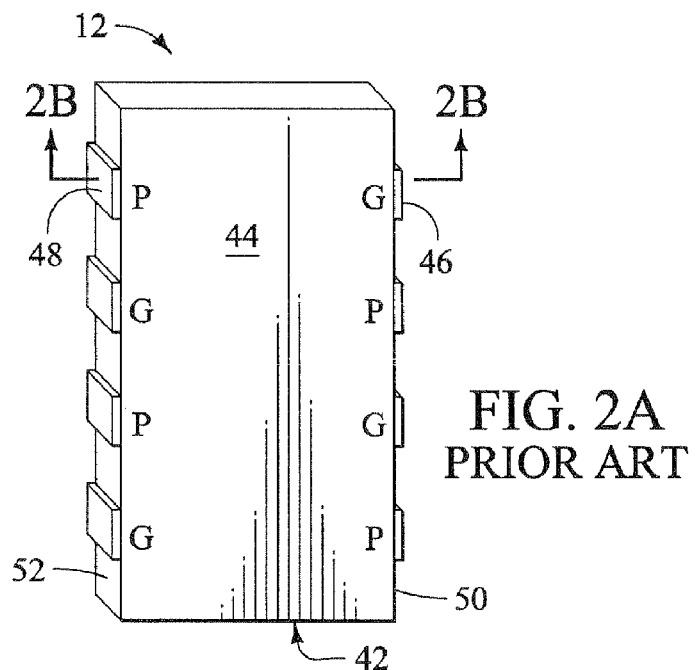
FIG. 2A is a perspective view of the land-side decoupling capacitor used in the device of FIG. 1.

FIG. 2A illustrates in perspective view a decoupling capacitor 12 of a type used in the device shown in FIG. 1. The capacitor includes a capacitor body 42 having a top-side 44 with a plurality of terminals 46, 48 on opposing sides 50, 52 of the body. The terminals 46, 48 are adapted to be electrically coupled to power and ground—denoted by power 'P' and ground 'G'. The capacitor 12 shown includes a plurality of terminals on either side 46, 48 in alternating arrangement so that power terminals are directly opposed to (such as power terminal 48 from ground terminal 46) and adjacent to ground terminals. It is understood, of course that other capacitors can be used such as those with power and ground terminals opposing like terminals.

Figure 2B:
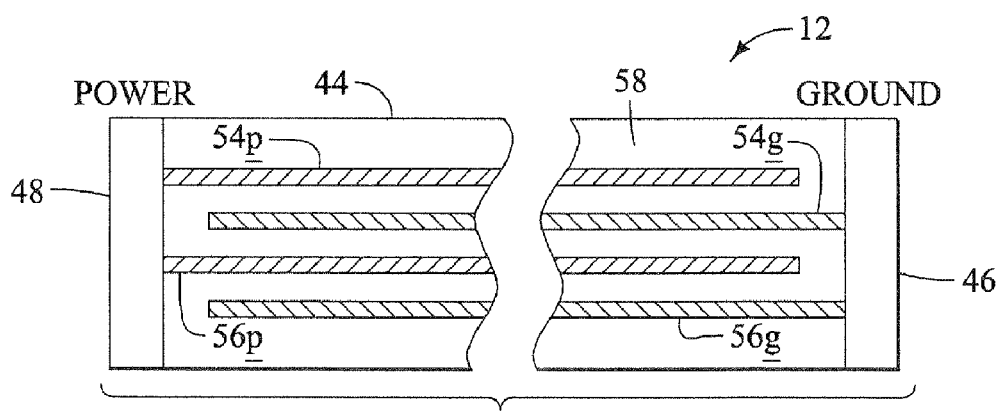
FIG. 2B is a cross-section view of the land-side decoupling capacitor of FIG. 2A taken along lines 2B-2B.

FIG. 2B illustrates a cross-section view of the capacitor of FIG. 2A taken along line 2B-2B. The capacitor 12 includes a plurality of conductive layers coupled to the power terminal 48 such as layers 54p and 56p, and a plurality of conductive layers coupled to ground terminal 46 such as layers 54g and 56g. Conductive layers are electrically isolated from adjacent conductive layers by a dielectric layer of dielectric material 58 well known in the art and not described here. Although four such conductive layers are shown in capacitor 12, it is understood that such a capacitor can have hundreds of layers.

As shown best in FIG. 1, the top-side 44 of decoupling capacitor 12 is affixed to the underside of IC package 22 so that the terminals 46, 48 of the capacitor electrically couple to respective power/ground traces 28, 30 within the package 22. The decoupling capacitors 12 are not directly coupled to motherboard 34 and thus cannot supply a shunt for power between the motherboard 34 and package 22. Instead, the all current conducted between the motherboard 34 and package 22 is carried through pins located about the periphery of the package received within sockets 32 on the motherboard 34. As stated above, the anticipated maximum current required to power designs in the near future will exceed socket limitations by 20%~30% and thus require new power shunt designs.

FIG. 3A illustrates an integrated circuit device 60 that includes a set of land-side capacitors (LSC) 62, 64 constructed and arranged in accordance with the present invention. Like numbers denote like elements. Starting from the top of FIG. 3A, an integrated circuit die 16 and one or more discrete capacitors (DSC) 18, 20 are housed by IC package 22. Integrated circuit 16 contains one or more circuits that are electrically connected to IC package 22. In one embodiment of the present invention, integrated circuit 16 is a microprocessor, although integrated circuit 16 could be other types of devices in other embodiments. In the example shown, integrated circuit 16 is a "flip chip" type of integrated circuit, meaning that the input/output and power/ground terminations on the chip can occur at any point on its surface. After the chip or die 16 has been readied for attachment to IC package 22, it is flipped over and attached, via solder bumps or balls 24 to matching pads (not shown) on the top surface 26 of IC package 22. Alternatively, integrated circuit 16 could be a surface mount chip, where input/output and power/ground terminations are connected to IC package 22 using bond wires to pads on the top surface 26 of the IC package 22.

Integrated circuit 16 contains one or more circuits that are electrically connected to IC package, as via ball connectors 24. While some of the ball connectors 24 couple to input/output circuits for transferring digital information between the die 16 and the remainder of the integrated circuit device 10, others 24p, 24g are used to provide connectors to power 28 (denoted in dashed line) and ground 30 (denoted in dotted line) conductors within the package 22. One or more of the IC circuits act as a die load, which may require capacitance, noise suppression, and/or power dampening. Some of this capacitance is provided by the discrete capacitors 18, 20 spaced about the integrated circuit die 16 and electrically coupled to the power 28 and ground 30 conductors within the package.

IC package 22 is coupled to a socket 32 on a PC board 34. In the example shown, IC package 22 includes pins (shown by traces 66, 68 within socket 32) that mate with pads 36 and complementary pin holes in socket 32. Alternately, IC package 22 could be electrically and physically connected to PC board 34 using solder connections, such as ball grid array connections, for example. These traces are also referred to herein as first and second type conductive portions with the first type being power and the second type ground.

PC board 34 could be, for example, a motherboard for a computer system. As such, it acts as a vehicle to supply power 'P', ground 'G', and other types of signals to integrated circuit 16. These power, ground, and other signals are supplied through traces 38, 40 on PC board 34, socket 32, pins 66, 68, and traces 28, 30 on IC package 22 to provide a first power source path for the die load 16. The IC device 10 described above in conjunction with various embodiments could be connected to a PC board forming part of a general-purpose computer system.

As sockets are formed on the motherboard 34 top surface 70, a coupling of the package 22 to the motherboard creates a cavity 72 bounded by the sockets 32, a suspended underside 74 of the package 22, and a top-side 70 of the motherboard 34. The land-side capacitors (LSC) 62, 64 are positioned within the cavity 72 and electrically coupled between the motherboard power/ground traces 38, 40 and the package power/ground traces 28, 30 to provide a second power source path for the die load 16 supplemental to the first path through the pins 66, 68. The capacitors 18, 20 coupled to the top surface 26 of the package 22 and laterally spaced from the die load 16 provide a third power source path for the die load. The arrangement of the CDCS 62, 64 fulfills the dual function of providing decoupling capacitors with the capability of supplying an additional path of power supply to the die load 16. The vertical LSCs now are connected to package power/ground (P/G) pads and motherboard P/G pads. This type of placement of a decoupling capacitor makes the capacitor itself be a DC shunt also. The capacitor with this new placement is called capacitor DC shunt (CDCS). The number of capacitors can be doubled due to the vertical placement. Tests have shown that the invention provides a very effective DC shunt that will provide a path for 90% of the total current requirements of the die load 16 and, consequently, reduce the power dissipation and related reliability concerns within the pins. This moves the high DC current away from pins. By doing this, the power dissipation through the pins is decreased about 90%, which is expected to remove reliability concerns that involve heat. Because of the extremely high current of future high power CPU's, this is an expected need. Without this invention, self-heating and resulting reliability issues are expected. In addition, the number of pins needed may end up greater than the number can be supplied.

Figure 3B:
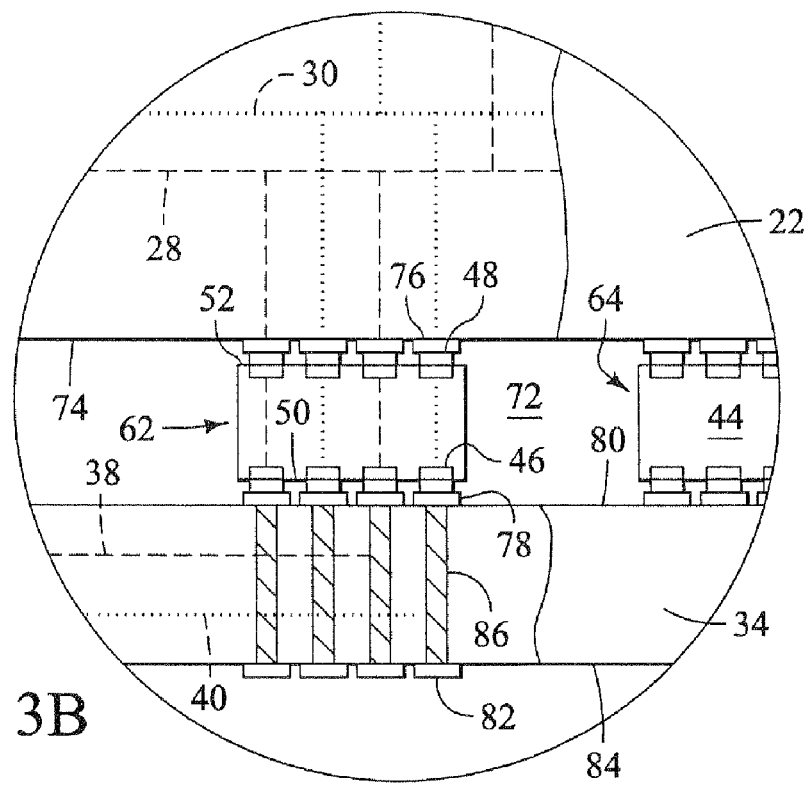
FIG. 3B is a side elevation cross-section view of a portion of the device of FIG. 3A showing the arrangement of a capacitor DC shunt (CDCS) within the device according to a preferred embodiment of the invention.

A magnified view of the CDCS 62 is shown in FIG. 3B. Capacitor 62 is shown rotated 90° from the position shown in FIG. 1 so that terminals 48 on one side 52 of the capacitor body are coupled to package-side pads 76 and traces 28, 30 within the package 22, and terminals 46 on the opposing side 50 are coupled to motherboard-side pads 78 and traces 38, 40 within the motherboard 34. The terminals 46, 48 in FIGS. 3A and 3B are shown coupled to respective power/ground where terminals are opposed to like terminals. It is understood, however, that the terminals can be arranged with traces to that the terminals are different from those opposing them such as in the capacitor of FIGS. 2A and 2B without departing from the spirit of the invention. The power and ground layers within the capacitor 62 are disposed oblique relative to an upper surface 80 of the motherboard 34 and to the lower surface 74 of the package 22.

Back-side cap pads 82 are disposed on bottom surface 84 of the motherboard 34. The back-side cap pads can be used as a metal contact for heating and then soldering the capacitors 62, 64 to the motherboard 34. Front side cap pads 78 are disposed on an upper surface 80 of the motherboard 34 and in direct contact with the terminals 46 of capacitor 62. Vias 86, extending through motherboard 34 from backs-side cap pads 82 to front-side cap pads 84, are capable of conducting heat between the cap pads for purposes which will be explained further with reference to FIGS. 7A-7C. There should preferably be as many vias between each set of pads 82, 84, and particularly directly beneath the front-side cap pad as possible to lower the resistance in the vertical direction. The low resistance path provides a DC shunt and reduces the maximum current in each socket pin. The low resistance path can also make the current uniformly flows in each layer.

Figure 4:
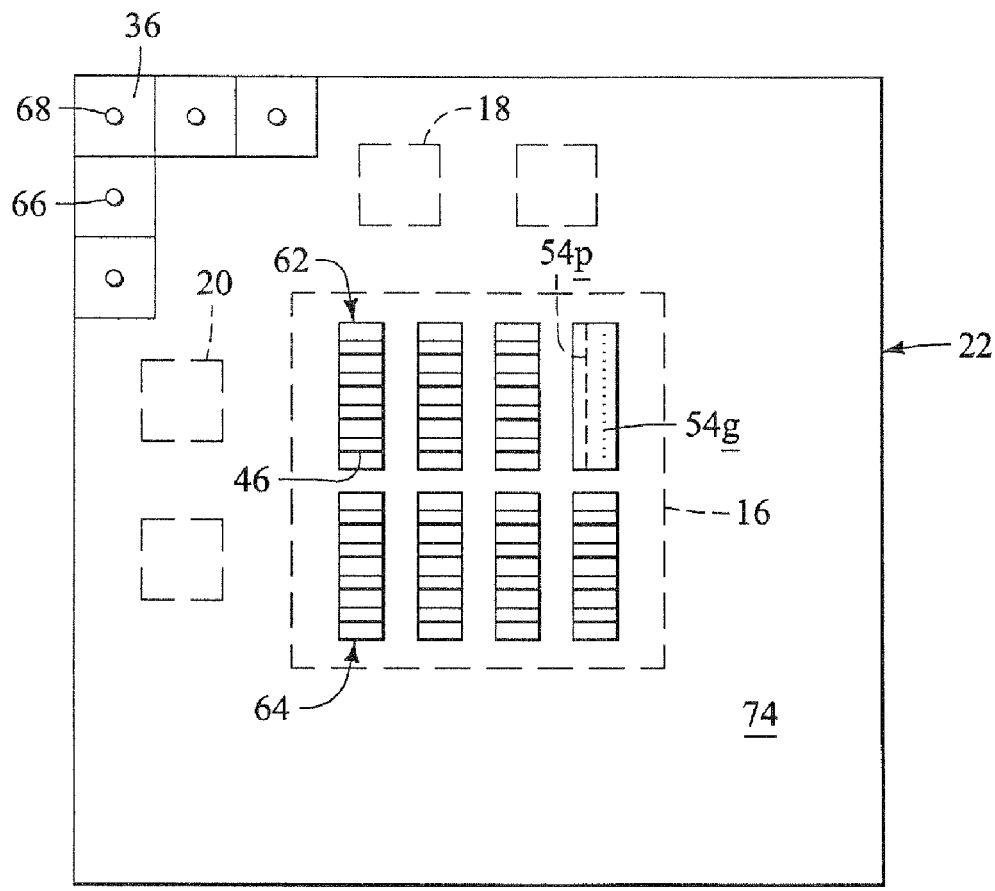
FIG. 4 is a bottom-up plan view of device of FIG. 3A.

FIG. 4 illustrates the plan-view arrangement of the components of integrated circuit device 60 where FIG. 3A is viewed from the left side of FIG. 4. Shown is the package 22 having an underside or lower surface 74. Affixed to the lower surface are pins 66, 68 arranged about the periphery of the package 22 and adapted to couple with the sockets (not shown) within the motherboard (also not shown). Only a small portion of the pins are illustrated and it is understood that such pins typically surround the periphery of the package 22. A vertical arrangement of capacitors 62, 64 are shown within a dashed box 16 denoting the placement of the die load on the upper surface of the package 22. As will be appreciated, the capacitors 62, 64 are located directly beneath the die load 16 so that the distance between the capacitor affixed to the underside of the package and the die load affixed to the top surface of the package is minimized. Discrete capacitors 18, 20 are shown laterally spaced from and surround the die 16.

Figure 5:
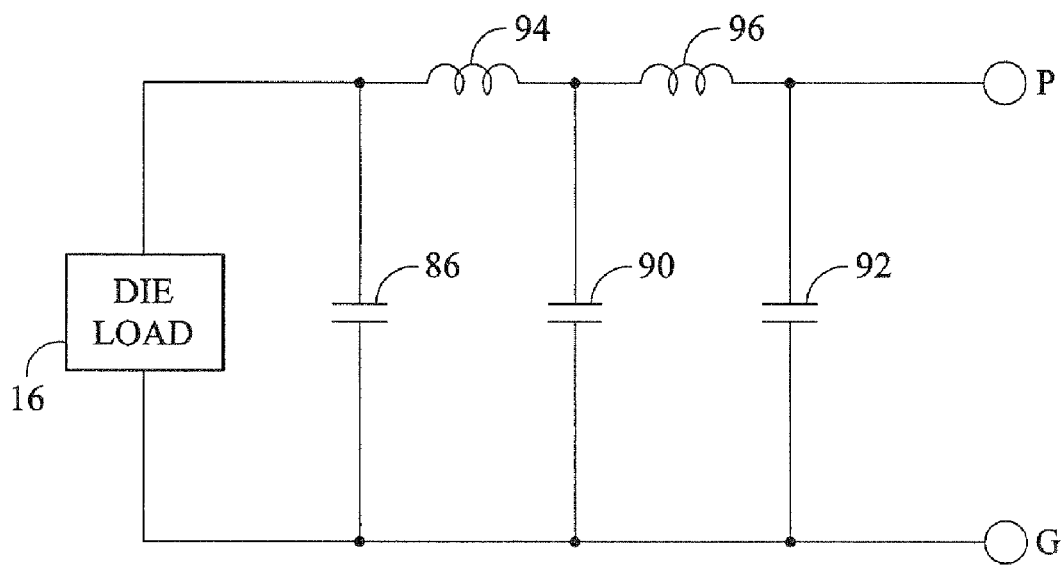
FIG. 5 illustrates an electrical circuit that simulates the electrical characteristics of the device of FIG. 3A including associated capacitors.

FIG. 5 illustrates an electrical circuit that simulates the electrical characteristics of the integrated circuit device 60 illustrated in FIG. 3A. The circuit shows a die load 16, which may require capacitance or noise dampening in order to function properly. Some of the capacitance can be supplied by capacitance 88 located on the die. Other capacitance, however, is provided off chip in accordance with various embodiments of the present invention, as indicated by off-chip capacitors 90 and 92.

Off-chip capacitor 90 represents the decoupling capacitor also serving as DC shunts 62, 64. Capacitor 90 is located some distance, however small, from die load 16. Accordingly, some inductance 94 exists between the die load and capacitor 90. In order to minimize the inductance 94, capacitor 90 is placed as close as possible to die load 16 such as directly beneath the load as shown in FIG. 4.

Off-chip capacitor 92 represents the discrete capacitors 18, 20 shown in FIG. 3A. This capacitance 92 exists some distance from the load and from the low inductance capacitor 90, resulting in some inductance 96 between off-chip capacitor 92 and the die load 16. Again, placing the self-aligned or discrete capacitors as close as possible to the low inductance capacitor 90 and the die load 16 minimizes this inductance 96.

Figure 6B:
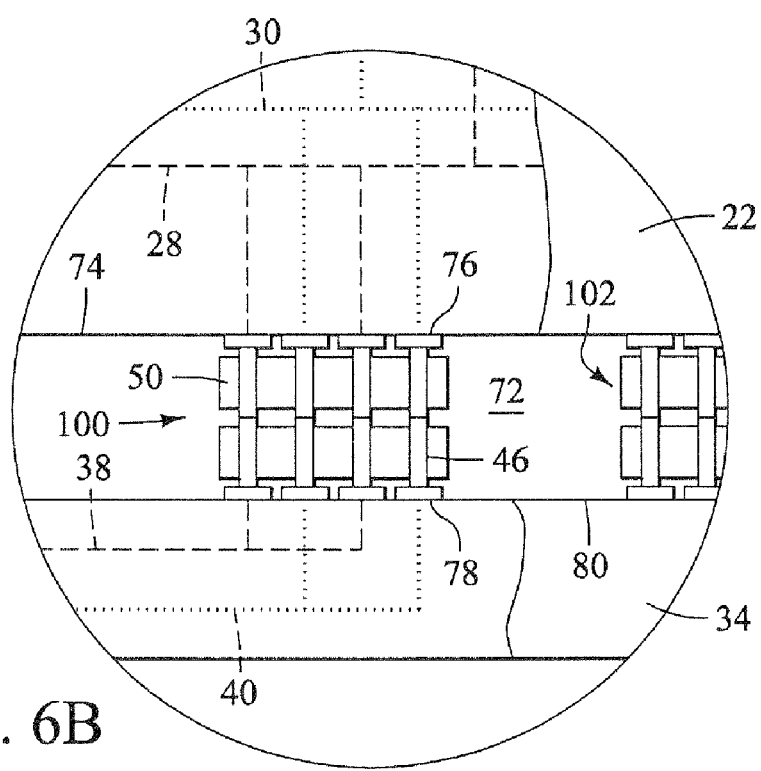
FIG. 6B is a side elevation cross-section view of a portion of the device of FIG. 6A showing the arrangement of a capacitor DC shunt (CDCS) within the device according to an alternate embodiment of the invention.
Figure 6A:
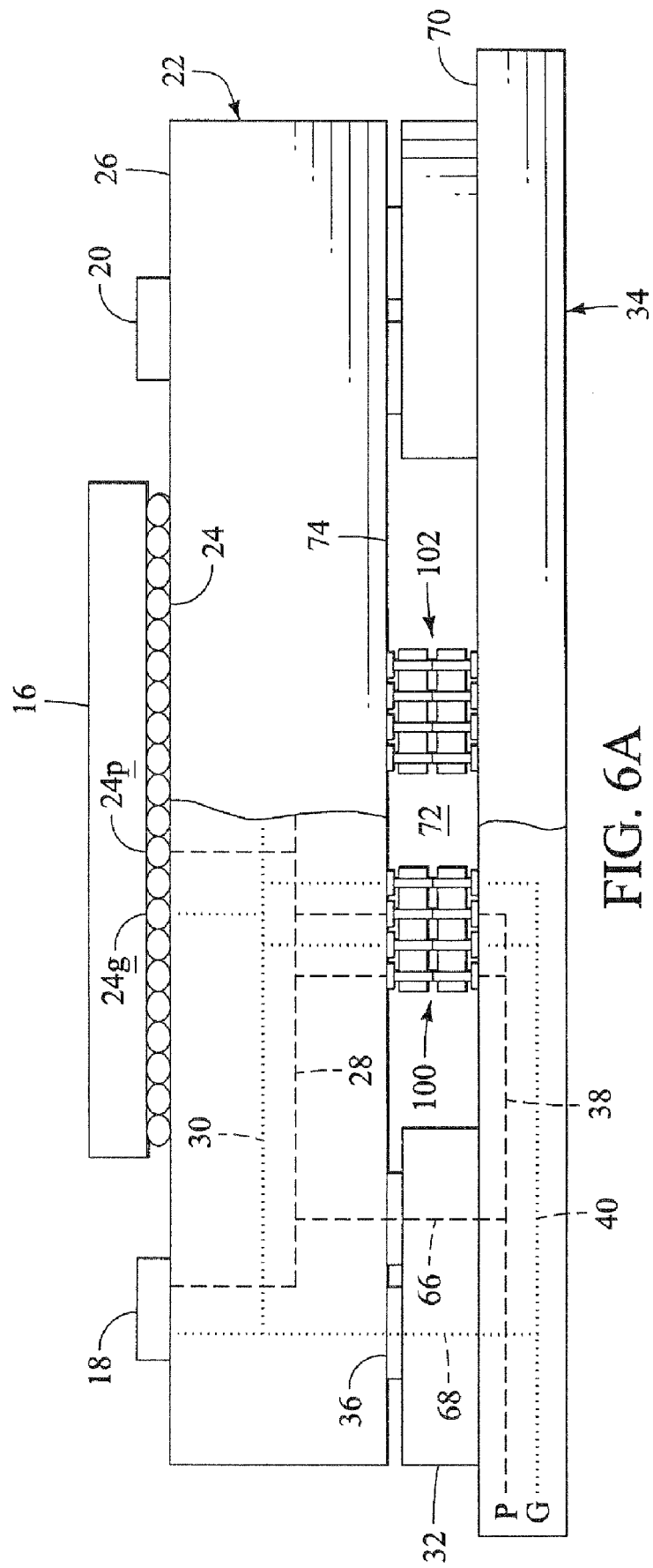
FIG. 6A is a side elevation with partial cross-section of an integrated circuit device constructed according to an alternate embodiment of the invention.

FIG. 6A illustrates an integrated circuit device 60 that includes a set of capacitor DC shunts 100, 102 constructed and arranged in accordance with an alternate embodiment of the present invention. Existing LSCs are stacked to form a new CDCS. The first advantage of these designs is no package design change is necessary. The second advantage of these designs is no new part is needed. All CDCS designs utilize existing capacitors. Like numbers denote like elements of those shown in FIG. 3A.

Starting from the top of FIG. 6A, an integrated circuit die 16 and one or more discrete capacitors (DSC) 18, 20 are housed by IC package 22. Integrated circuit 16 contains one or more circuits that are electrically connected to IC package 22. In one embodiment of the present invention, integrated circuit 16 is a microprocessor, although integrated circuit 16 could be other types of devices in other embodiments. In the example shown, integrated circuit 16 is a "flip chip" type of integrated circuit, meaning that the input/output and power/ground terminations on the chip can occur at any point on its surface. After the chip or die 16 has been readied for attachment to IC package 22, it is flipped over and attached, via solder bumps or balls 24 to matching pads (not shown) on the top surface 26 of IC package 22. Alternatively, integrated circuit 16 could be a surface mount chip, where input/output and power/ground terminations are connected to IC package 22 using bond wires to pads on the top surface 26 of the IC package 22.

Integrated circuit 16 contains one or more circuits that are electrically connected to IC package, as via ball connectors 24. While some of the ball connectors 24 couple to input/output circuits for transferring digital information between the die 16 and the remainder of the integrated circuit device 10, others 24$p$, 24$g$ are used to provide connectors to power 28 (denoted in dashed line) and ground 30 (denoted in dotted line) conductors within the package 22. One or more of the IC circuits act as a die load, which may require capacitance, noise suppression, and/or power dampening. Some of this capacitance is provided by the discrete capacitors 18, 20 spaced about the integrated circuit die 16 and electrically coupled to the power 28 and ground 30 conductors within the package.

IC package 22 is coupled to a socket 32 on a PC board 34. In the example shown, IC package 22 includes pins (shown by traces 66, 68 within socket 32) that mate with pads 36 and complementary pin holes in socket 32. Alternately, IC package 22 could be electrically and physically connected to PC board 34 using solder connections, such as ball grid array connections, for example. These traces are also referred to herein as first and second type conductive portions with the first type being power and the second type ground.

PC board 34 could be, for example, a motherboard for a computer system. As such, it acts as a vehicle to supply power 'P', ground 'G', and other types of signals to integrated circuit 16. These power, ground, and other signals are supplied through traces 38, 40 on PC board 34, socket 32, pins 66, 68, and traces 28, 30 on IC package 22 to provide a first power source path for the die load 16. The IC device 10 described above in conjunction with various embodiments could be connected to a PC board forming part of a general-purpose computer system.

As sockets are formed on the motherboard 34 top surface 70, a coupling of the package 22 to the motherboard creates a cavity 72 bounded by the sockets 32, a suspended underside 74 of the package 22, and a top-side 70 of the motherboard 34. Capacitor DC shunts (CDCS) 100, 102—constructed and arranged according to an alternate embodiment of the invention—are positioned within the cavity 72 and electrically coupled between the motherboard power/ground traces 38, 40 and the package power/ground traces 28, 30 to provide a second power source path for the die load 16 supplemental to the first path through the pins 66, 68. The capacitors 18, 20 coupled to the top surface 26 of the package 22 and laterally spaced from the die load 16 provide a third power source path for the die load. The arrangement of the CDCS 100, 102 fulfills the dual function of providing decoupling capacitors with the capability of supplying an additional path of power supply to the die load 16.

A magnified view of the CDCS 100 is shown in FIG. 6B. Capacitor 100 is shown in a similar position to the capacitor shown in FIG. 1 except that the terminals 46 (terminal 48 is blocked from view) on both sides 50 (side 52 is blocked from view) of the capacitor 100 form a conductive bridge between the motherboard 34 and the package 22. Given the height of cavity 72 between the package and motherboard, the standard capacitor shown in FIG. 1 is double stacked so that respective terminals on either side of the capacitor body are electrically coupled to package-side pads 76 and traces 28, 30 within the package 22, and to motherboard-side pads 78 and traces 38, 40 within the motherboard 34. The power and ground layers within the capacitor 100 are disposed parallel relative to an upper surface 80 of the motherboard 34 and to the lower surface 74 of the package 22.

Figure 7A:
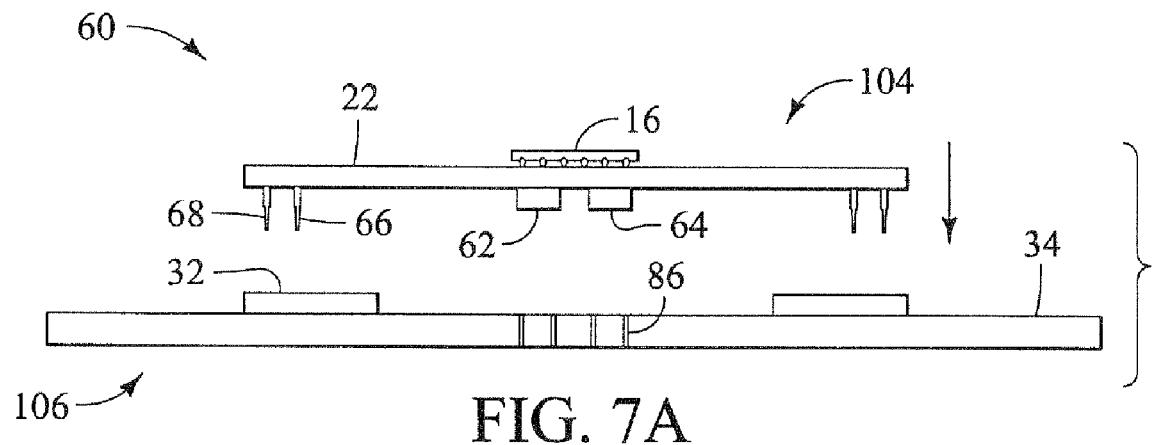
FIGS. 7A-7C illustrate process steps for assembling the device of FIG. 3A.
Figure 7B:
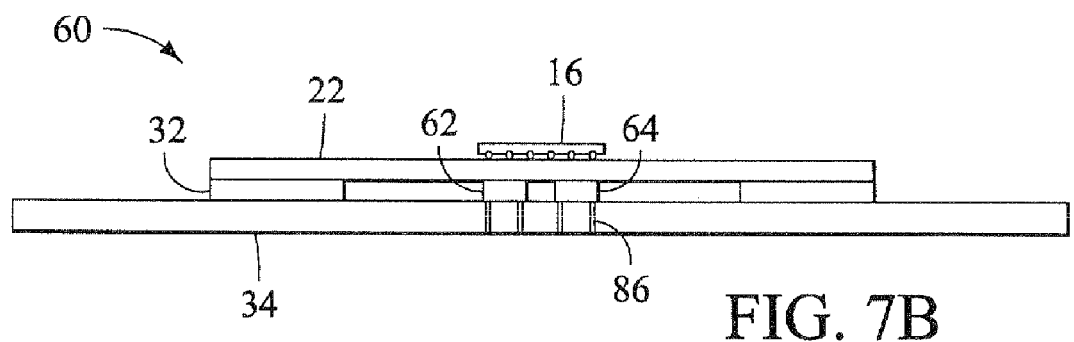
Figure 7C:
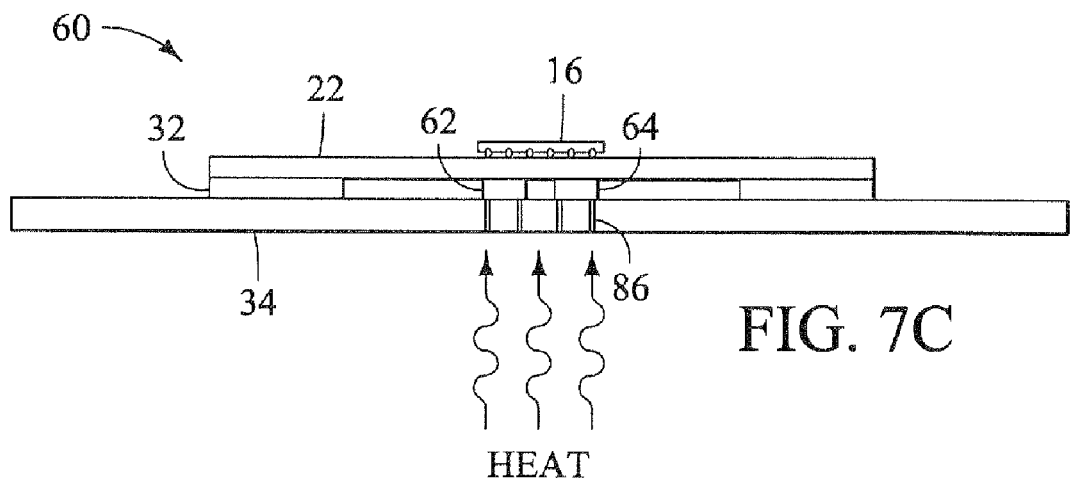

FIGS. 7A-7C illustrate the method for assembling the integrated circuit device 60 according to a preferred embodiment of the invention. Die 16, package 22, pins 66, 68, and DC shunt capacitors 62, 64 are configured as shown in FIG. 3A to form a top assembly 104 of the device 60. Discrete capacitors 18, 20 are not shown but are assumed to exist in the final device. The top assembly 104 is intended to mate with a bottom assembly 106 comprising a motherboard 34 with heat-transferring vias 86 formed therethrough, and sockets 32 with associated pin-receiving apertures (not shown) such as that shown in the device of FIG. 3A. Cap pads, such as those electrically coupling the DC shunt capacitors 62, 64 to the underside of package 22, and those located top-side and bottom-side of the vias 86 are not shown in FIG. 7A but can still exist there. The top assembly 104 is lowered onto the bottom assembly 106 so that the pins 66, 68 engage with the socket 32 and the DC shunt capacitors 62, 64 contact the heat-transferring vias 86 and be electrically coupled to the power/ground conductive portions within the motherboard to form the assembly shown in FIG. 7B. Finally, heat is applied to the vias 86 in FIG. 7C at the metal bottom-side cap pads and the heat conducted upward to the DC shunt capacitors 62, 64. The heat conducted and applied to the terminals contacting the motherboard cause the terminals to be soldered into contact with the electrical contacts thereon to form a completed assembly.

Having described and illustrated the principles of the invention in a preferred embodiment thereof, it should be apparent that the invention can be modified in arrangement and detail without departing from such principles. I claim all modifications and variation coming within the spirit and scope of the following claims.

What is claimed is:

1. A semiconductor device comprising:
   a motherboard having first and second type conductive portions embedded therein coupled to a power source;
   a socket portion defined on and projecting above an upper surface of the motherboard and electrically coupled to the first and second type conductive portions;
   a package coupled to the motherboard via the socket portion, said package having a suspended portion between the sockets wherein an underside of the suspended portion is spaced from an opposing upper surface portion of the motherboard;
   package conductors within the package adapted to transmit current from a bottom surface to a top surface of the package;
   a die load affixed to a top surface of the package above the suspended portion and electrically coupled via the package conductors through the socket portion to the first and second type conductive portions to provide a first power source path for the die load; and
   a capacitor located within the space between the suspended portion of the package and the opposing upper surface portion of the motherboard, said capacitor being electrically coupled between the first and second type conductive portions within the motherboard and the package conductors to provide a second power source path for the die load; and
   wherein said capacitor including:
   a conductive layer of a first type;
   a conductive layer of a second type;
   a dielectric layer that electrically isolates the first type conductive layer from the second type conductive layer; and
   terminals of a first type and a second type located along a first side of the capacitor and along an opposing side of the capacitor, said terminals coupled between the motherboard and the package and electrically coupling the first and second type conductive portions within the motherboard and the package conductors to respective type conductive layers of the capacitor.

2. The semiconductor device of claim 1, said first and second type conductive layers and dielectric layer disposed oblique relative to the upper surface of the motherboard.

3. The semiconductor device of claim 1, wherein said capacitor includes a plurality of conductive layers of a first type and a plurality of conductive layers of a second type electrically isolated from the layers of the first type by a plurality of dielectric layers.

4. The semiconductor device of claim 1, said first and second type conductive layers and dielectric layer disposed parallel relative to the upper surface of the motherboard.

5. The semiconductor device of claim 1, further including:
   back-side cap pads disposed on a bottom surface of the motherboard;
   front-side cap pads disposed on a top surface of the motherboard and in direct contact with said capacitor terminals; and
   vias between the back-side and front side cap pads for transferring heat applied to the back-side cap pad to the front-side cap pad.

6. The semiconductor device of claim 1, wherein the capacitor is located directly beneath the die load so that the distance between the capacitor affixed to the underside of the package and the die load affixed to the top surface of the package is minimized.

7. The semiconductor device of claim 1, further including at least one capacitor coupled to a top surface of the package and laterally spaced from the die load, said capacitor electrically coupled the package conductors and providing a third power source path for the die load.

* * * * *